United States Patent [19]

Boone et al.

[11] 4,404,518
[45] Sep. 13, 1983

[54] METHOD AND DEVICE FOR THE MEASUREMENT OF THE CONTACT RESISTANCE OF GALVANIC SURFACE LAYERS

[75] Inventors: Didier Boone, Oostkamp; Rolf Cousin, Loppem, both of Belgium

[73] Assignee: Siemens Aktiengesellschaft, Berlin & Munich, Fed. Rep. of Germany

[21] Appl. No.: 256,795

[22] Filed: Apr. 23, 1981

[30] Foreign Application Priority Data

Jul. 28, 1980 [DE] Fed. Rep. of Germany ....... 3028535

[51] Int. Cl.³ ........................................... G01R 27/02
[52] U.S. Cl. ...................................... 324/62; 324/421
[58] Field of Search ........................ 324/62, 65 R, 421

[56] References Cited

PUBLICATIONS

Garte: "What Designers Need to Know about Low-Voltage Contacts"-Electronics-vol. 48-Oct. 3, 1975-pp. 105-107.
Kameoka et al.: "Very High and Very Low Resistances . . . ", Hewlett Packard Journal-vol. 22-No. 7-Mar. 1971.
Olsowski: "Prazisions-Konstant-Stromquelle . . . ", Elektronik-(Germany)-vol. 7-p. 88-Apr. 5, 1979.
Pivnichny et al.: "Four-Point Method Tests Solder Joints", Electronics (USA)-vol. 48-No. 7-p. 106-Apr. 3, 1975.
Zezulka: "A New Method for Evaluation of Contact Resistance", Sdelovaci Tech. (Czechoslovakia)-vol. 27-No. 3-Mar. 1979.

Primary Examiner—Stanley T. Krawczewicz
Assistant Examiner—Jose M. Solis
Attorney, Agent, or Firm—Hill, Van Santen, Steadman & Simpson

[57] ABSTRACT

A method and device is disclosed for the measurement of contact resistances of galvanic surfaces. Such contact resistances are subject to very great fluctuations. In order to measure the contact resistance, several wire pieces are provided with the galvanic surface. These wire pieces are stacked crosswise over one another and are pressed against one another with a defined pressure. The total resistance is measured between the uppermost and lowermost wire piece, and this total resistance is then divided by the number of points of contact.

6 Claims, 2 Drawing Figures

METHOD AND DEVICE FOR THE MEASUREMENT OF THE CONTACT RESISTANCE OF GALVANIC SURFACE LAYERS

BACKGROUND OF THE INVENTION

The invention concerns a method for measurement of the transition or contact resistance of galvanic surface layers as well as a device for execution of the method.

The transition or contact resistance between electrically coated surfaces is subject to very strong fluctuations. This applies in particular in the case of gold surfaces. It is, however, desirable to know the contact resistance of the galvanic layers, in particular in the case of galvanically coated contact surfaces. A direct measurement of the contact resistance is difficult due to the relatively small values since this requires complicated techniques.

SUMMARY OF THE INVENTION

The invention is thus based upon the problem of creating a method of the type described above and a device for the execution of the method with which in a simple manner and with practically discretionary precision, the contact resistance can be measured on galvanically coated surfaces.

According to the invention, wire pieces provided with the galvanic layer are stacked crosswise over one another and are pressed against one another with a defined pressure, and that between the uppermost and lowermost wire piece, the total resistance is measured.

The contact resistance which is sought then results from this, divided by the number of points of contact.

In a practical manner, the wire pieces themselves consist of a material whose resistance is known sufficiently precisely.

For example, it is advantageous for the measurement of the contact resistance of a galvanically applied gold layer to use a corresponding thickly gilded wire. Accordingly, by means of a corresponding selection of the wire material, the contact resistance and its change in dependent upon time and temperature can be determined with or without the influence of the wire material, depending upon whether or not as a base material, a material is used which is stable over time and temperature.

According to the invention, a system for the execution of the invention consists in that the wire pieces are inserted through corresponding pairs of apertures of a hollow cylindrical body of insulating material. The apertures are provided displaced with respect to one another in an axial direction over the circumference of the body in such a manner that the wire pieces in each case pass through the axis of the hollow cylindrical body and lie crosswise over one another.

DESCRIPTION OF THE PREFERRED EMBODIMENTS

Figure 1:
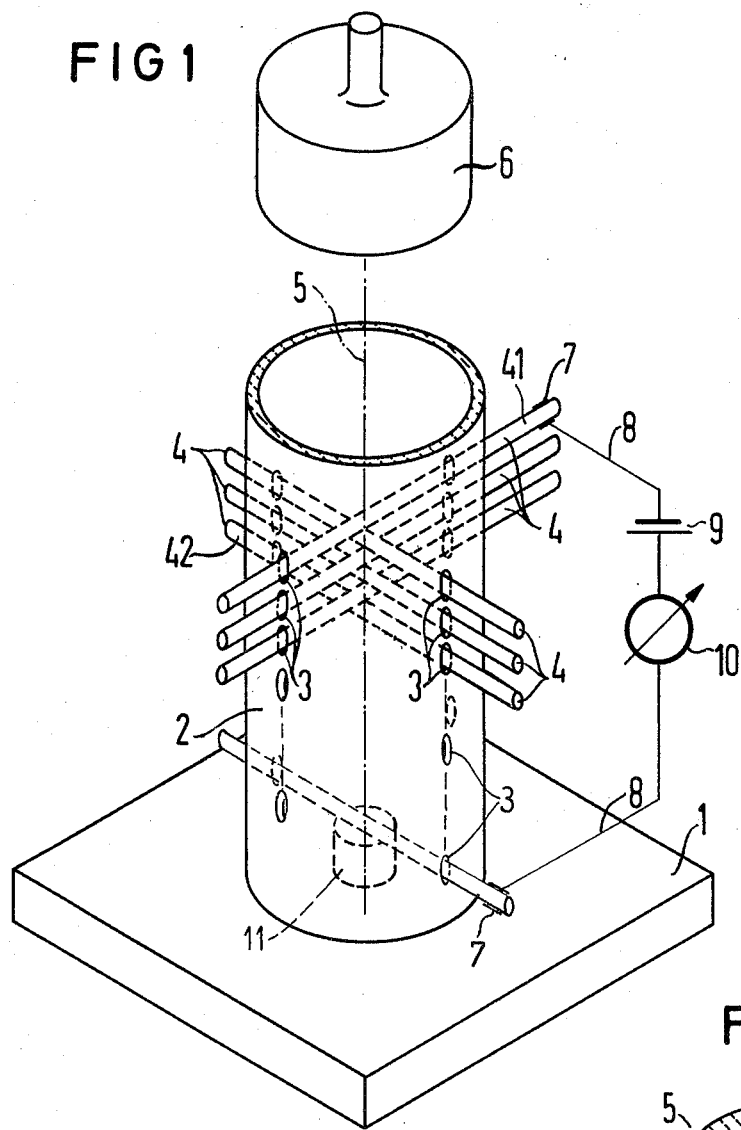
FIG. 1 is a perspective view of a device for the crosswise stacking of wire pieces according to the invention.
Figure 2:
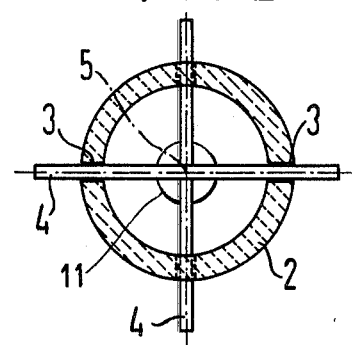
FIG. 2 is a top view of the device of FIG. 1.

A hollow cylindrical body 2 of insulating material, in particular of ceramic, with axis 5 aimed at a right angle to a base plate 1, is fastened on the plate 1 of insulating material. Body 2 has apertures 3 corresponding in pairs which are distributed in the axial direction over its circumference, and which are provided for the insertion of wire pieces 4. These apertures are designed in an oval or slot-shaped fashion in the axial direction. As FIG. 2 shows in particular, the apertures 3 for the wire pieces 4 are arranged displaced by 90° with respect to one another in the circumferential direction. Also, the midpoints of consecutive pairs of apertures, which in each case are displaced in the axial direction with respect to one another by 90°, are displaced with respect to one another by the thickness of the wire pieces 4 in the direction of the axis 5.

If wire pieces 4 are inserted in all corresponding pairs of apertures 3, then the wire pieces 4 are therefore stacked crosswise over one another such that the wire pieces contact one another in a stress-free manner and the points of contact of the wire pieces 4 are located on the axis 5 of the hollow cylindrical body 2. The lowermost wire 42 is supported at its center as shown at 11 in order to prevent a sagging through of the wires. The wire pieces 4 sticking in the body 2 are loaded with the help of a piston-like weight 6 which is introduced into the body 2 from above. The pressure exercised by the weight is selected large enough so that a good contact arises between the wire pieces 4, but still no deformation of the wire pieces 4 takes place at the points of contact. It is advantageous to select the size of the pressure such that a further increase would only bring about an unimportant change of the total resistance. If now with the help of connectors or clips 7, lines 8 are connected to the uppermost and lowermost wire piece (41 or, respectively, 42), and the lines 8 are connected via a measuring instrument 10 with a current source 9, then the total resistance of the arrangement can be measured. This is composed essentially of the resistance to the flow of current (line resistance) of twice the half length of the wire piece, as well as consisting of the contact resistance of all n points of contact of the wire pieces. Compared to this, the resistance which is composed of the parallel junction of the resistance of the base material of the wire pieces and the surface resistance of the galvanic coating of the wire pieces is negligible. From the total resistance, the individual contact resistance between two galvanic layers can be easily computed since the resistance to the flow of current (line resistance) is known. If this is subtracted from the total resistance, one obtains the contact resistance by means of dividing the value obtained by the number n points of contact between in each case two wire pieces 4.

The contact resistance between the lines 8 and the wire pieces 41, 42 which are connected therewith can be eliminated by means of suitable connection methods. If a multiplicity of contact points is provided, the contact resistance can be determined sufficiently precisely with a relatively simple meauring head. This precision can otherwise be selected as high as desired by means of an increase of the number of the wire pieces used. Further, the possibility exists of carrying out the measurement in the case of greatly varied measuring conditions so that influences, for example, of temperature, of the structure of the galvanic layer, of time and humidity, etc. can be investigated independently of one another.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A system for facilitating measuring contact resistance of galvanic surface layers on wire, comprising: a plurality of wire pieces provided with a galvanic surface layer being positioned through corresponding pairs of apertures of a hollow cylindrical body of insulating material; said pairs of apertures being displaced with respect to one another along a longitudinal axis of the hollow body, being oval or slot-shaped in a direction of the longitudinal axis, and adjacent pairs being positioned relative to one another in a circumferential direction such that the wire pieces in each case pass through the longitudinal axis of the hollow cylindrical body and lie crosswise with respect to one another with one directly above and adjacent to the other; and means for pressing the wire pieces against one another with a defined pressure, whereby total resistance may be measured between an uppermost and lowermost wire piece with other crossed wire pieces in between.

2. A system according to claim 1 wherein said means for pressing the wire pieces is provided so that when a given pressure is applied substantially no deformation of the wire pieces occurs.

3. A system for facilitating measuring contact resistance of galvanic surface layers on wire, comprising: a plurality of wire pieces all being provided with a galvanic surface layer of a given material and being positioned through corresponding pairs of apertures of a hollow cylindrical body of insulating material; said pairs of apertures being displaced with respect to one another along a longitudinal axis of the hollow body, being oval or slot-shaped in a direction of the longitudinal axis, and adjacent pairs being positioned relative to one another in a circumferential direction such that the wire pieces in each case pass through the longitudinal axis of the hollow cylindrical body and lie crosswise with respect to one another with one directly above and adjacent to the other; and means for pressing the wire pieces against one another with a defined pressure, whereby total resistance may be measured between an uppermost and lowermost wire piece.

4. A system according to claim 3 wherein the apertures are dimensioned such that, with respect to a diameter of the wire pieces, with a given loading of the wire pieces no sagging through of the wire pieces takes place.

5. A system according to claim 3 wherein a weight is provided with is dimensioned to be received within the hollow body in order to bear on the uppermost wire piece and cause a contact between each pair of adjacent wire pieces.

6. A system according to claim 3 wherein adjacent aperture pairs are spaced from one another along a direction of the longitudinal axis by approximately a diameter of the wire pieces.

* * * * *